United States Patent [19]

Katayama et al.

[11] Patent Number: 4,613,382

[45] Date of Patent: Sep. 23, 1986

[54] METHOD OF FORMING PASSIVATED POLYCRYSTALLINE SEMICONDUCTORS

[75] Inventors: Yoshifumi Katayama, Tokorozawa; Toshikazu Shimada, Tokyo; Eiichi Maruyama, Kodaira, all of Japan

[73] Assignee: Hitachi, Ltd., Tokyo, Japan

[21] Appl. No.: 710,953

[22] Filed: Mar. 14, 1985

Related U.S. Application Data

[63] Continuation of Ser. No. 361,382, Mar. 24, 1982, abandoned.

[30] Foreign Application Priority Data

Mar. 30, 1981 [JP] Japan .................................. 56-45553

[51] Int. Cl.$^4$ ................... H01L 21/223; H01L 21/322
[52] U.S. Cl. .................................... 148/1.5; 136/258; 357/59; 427/39; 427/74; 427/86
[58] Field of Search ..................... 148/1.5; 427/39, 74, 427/86; 136/258 PC, 258 AM; 357/59

[56] References Cited

U.S. PATENT DOCUMENTS

| | | | |
|---|---|---|---|
| 4,217,374 | 8/1980 | Ovshinsky et al. | 427/39 |
| 4,239,554 | 12/1980 | Yamazaki | 357/30 X |
| 4,342,044 | 7/1982 | Ovshinsky et al. | 357/30 |

OTHER PUBLICATIONS

Chu et al, "Thin Film Polycrystalline Silicon Solar Cells", 13th IEEE Photovoltaic Spec. Conf. (78) Washington, Jun. 1978, pp. 1106–1110.

Heller et al, "Thin Film Polycrystalline n-GaAs Semiconductor Liquid Junction Solar Cells", 14th IEEE Photovoltaic Spec. Conf., (1980) San Diego, pp. 366–368, Jan. 1980.

Levinson et al, "Conductivity Behavior in Polycrystalline Semiconductor Thin Film Transistors", J. Appl. Phys., vol. 53, No. 2, pp. 1193–1202, Feb. 1982.

Seager et al, "Passivation of Grain Boundaries in Polycrystalline Silicon", Appl. Phys. Lett., vol. 34, No. 5, pp. 337–340, Mar. 1979.

Kamins et al, "Hydrogenation of Transistors Fabricated in Polycrystalline Silicon Films", IEEE Electron Dev. Lett., vol. EDL-1, No. 8, pp. 159–160, Aug. 1980.

Seager et al, "Improvement of Polycrystalline Silicon Solar Cells with Grain-Boundary Hydrogenation Techniques", Appl. Phys. Lett., vol. 36, No. 10, pp. 831–832, May 1980.

Primary Examiner—Aaron Weisstuch
Attorney, Agent, or Firm—Antonelli, Terry & Wands

[57] ABSTRACT

A semiconductor device includes a polycrystalline semiconductor film body having at least one element selected from a group consisting of hydrogen, fluorine, chlorine, bromine, iodine, lithium, sodium, potassium, rubidium, and cesium included mainly around grain boundaries of the polycrystalline semiconductor film. The simultaneous inclusion of one of the halogen elements and one of the monovalent metal elements of the group described above is more effective to quench charges of the elements included. The content of the elements included is up to 40% by atomic ratio. As a result, the electronic characteristic of the polycrystalline semiconductor film are substantially improved.

16 Claims, 11 Drawing Figures

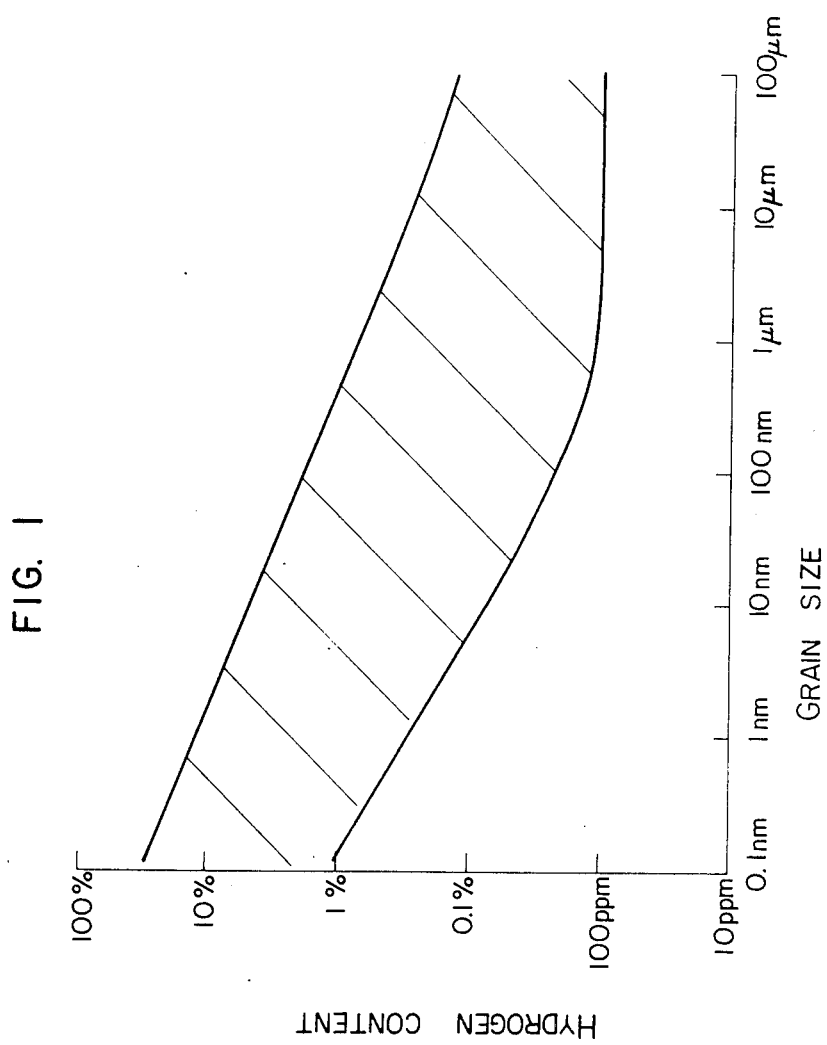

METHOD OF FORMING PASSIVATED POLYCRYSTALLINE SEMICONDUCTORS

This application is a continuation of application Ser. No. 361,382, filed Mar. 24, 1982, now abandoned.

The present invention relates to a polycrystalline thin film, and more particularly to a semiconductor device having a silicon polycrystalline semiconductor thin film.

In general, a polycrystalline thin film has the properties that it is easier to fabricate than a monocrystalline thin film and has a better electrical characteristic such as larger mobility of carriers than an amorphous thin film. However, polycrystalline thin films have not been widely used as a body of an electronic active device because of degradation of the electrical characteristics due to various defects present at crystal grain boundaries. The characteristic of the active device is degraded because dangling bonds of constituent atoms which are mainly present at polycrystal grain boundaries are electrically active and act as recombination centers or carrier scattering centers or cause grain boundary diffusion of impurities. As a result, it has been considered that a semiconductor thin film having many crystal grain boundaries is not proper to use in a semiconductor device having a pn junction.

A typical example of a semiconductor device having a polycrystalline film is disclosed in "Deposition and Properties of Polycrystalline Silicon Films for Solar Cells" which appeared in the Digest of Technical Papers. The 1st PHOTOVOLTAIC SCIENCE and ENGINEERING CONFERENCE IN JAPAN, Nov. 6–8, 1979 (Tokyo) pages 1–2.

It is an object of the present invention to provide a polycrystalline semiconductor thin film which has a reduced influence of the grain boundaries and can be used as a body of a semiconductor active device.

In order to achieve the above object, according to a feature of the present invention, a polycrystalline semiconductor thin film having at least one element selected from a group consisting of hydrogen, fluorine, chlorine, bromine, iodine, lithium, sodium, potassium, rubidium and cesium included mainly around the grain boundaries of the polycrystalline semiconductor thin film, is used as the body of the semiconductor device. The content of the element or elements varies depending on crystal grain size and a total content of up to 40% by atomic ratio on average of the film is preferable.

It is more preferable to include both at least one element selected from a group consisting of fluorine, chlorine, bromine, and iodine and at least one element selected from a group consisting of hydrogen, lithium, sodium, potassium, rubidium, and cesium because the addition of the elements from those groups can neutralize the charges of the added elements after the elimination of the dangling bonds.

The present invention will now be described in conjunction with the accompanying drawing, in which:

FIG. 1 shows the relation between the grain size of silicon and hydrogen content which exhibits a remarkable effect of the present invention;

Figure 2A:
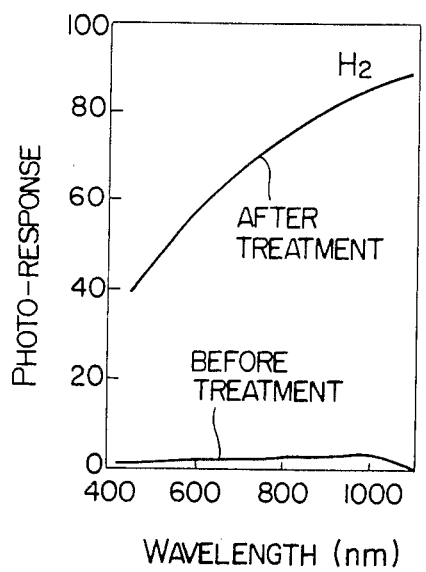
FIGS. 2a to 2d show comparative charts of variations of light sensitivity of a polycrystalline silicon film before and after plasma treatment.

In general, the dangling bonds which are present mainly around the grain boundaries of the polycrystalline semiconductor thin film form electrically active localized levels in a forbidden band of the semiconductors, and the density of the localized levels can be decreased by adding appropriate monovalent atoms to the dangling bonds.

It has been found that the density of the localized levels can be reduced by adding the abovementioned monovalent elements such as hydrogen or fluorine to the body of the polycrystalline semiconductor which includes many dangling bonds.

The above effect is not only observed in polycrystalline silicon films but also is more or less observed in a mixed crystal such as polycrystalline silicon-germanium, a III-V group compound such as polycrystalline gallium arsenide, or a II-VI group compound such as polycrystalline cadmium sulfide. In a polycrystal in which the silicon content is more than 50% of the total content, various localized levels are apt to be formed because chemical activity of the dangling bonds at the grain boundaries is high. Accordingly, the present method for reducing the localized levels by addition of a monovalent element is particularly effective to such polycrystalline film.

The grain size of the polycrystal to which the present invention is applicable may range from several nanometers at minimum to several millimeters at maximum. In general, a polycrystal may be considered as one from which a perfect halo pattern is not observed by electron beam or X-ray diffraction, a ring pattern or a spotly pattern indicating an orientation is observed. In such a polycrystal, it is considered that atoms are relatively regularly arranged in the respective crystal grains and the dangling bonds concentrate around the grain boundaries. Accordingly, the monovalent element for reducing the localized level must be added around the monocrystalline grain boundaries.

When the grain size of the crystal is large and the volume ratio of the grain boundaries to the total volume is relatively small, the content of the monovalent element included in the polycrystalline film may be 100 ppm by atomic ratio on average in order to obtain the effect of the present invention, but when the grain size of the crystal is small enough to approach amorphous state, the content may reach as much as 40 atomic. In the latter case, it may be considered to be nearly a mixed state of amorphous material and fine crystal grains although the main body is a polycrystalline. In this case, the densities of the localized levels at the boundaries of the amorphous material and the crystal grains can be reduced so that electronic material useful as photoconductor or fluorescent material can be provided.

As a substrate for such a polycrystalline thin film, a metal plate such as iron, stainless steel, nickel or aluminum, a ceramic such as alumina, a glass plate such as quartz or hard glass, or organic material such as polyimide may be used. One of the objects of the present invention is to impart to substrate material used to form a single crystal or a polycrystalline semiconductor thin film formed without satisfying a substrate temperature condition, a characteristic analogous to a single crystal usable as electronic material (such as mobility or photoconductivity). In some cases, a substrate which is heterogeneous to a semiconductor substrate may be used. In order to minimize contamination by impurity diffusion from the substrate in such a case, it is desirable to keep the forming temperature of the polycrystalline semiconductor thin film at a low level. While the maximum temperature is restricted depending on the type of the substrate, the upper limit is approximately 700° C., at which reaction between a metallic substrate and the semiconductor resulting in metal diffusion into the polycrystalline semiconductor thin film is likely to occur.

In adding the monovalent element around the grain boundaries of the polycrystalline semiconductor thin film, it is effective to thermally treat the polycrystalline semiconductor thin film in a plasma environment of the selected element. The heat treatment in the plasma environment is carried out in the following condition; environmental gas pressure is $10^{-2}$ pa–10 pa, an substrate temperature is 350° C.–650° C., an RF input power is 0.03 W/cm$^2$–10 W/cm$^2$ and RF frequency is 13.56 MHz, although it is not limited thereto.

The selected element may be introduced during the formation of the polycrystalline semiconductor thin film. When the element is introduced into the crystal grain boundaries, the same effect is obtained. The polycrystalline semiconductor thin film may be formed by sputtering of silicon in silicon halide environment such as SiF$_4$ or SiCl$_4$, glow discharge decomposition of SiF$_4$, forming GaAs polycrystal by reacting Ga with AsCl$_3$ in a glow discharge, or forming a CdS polycrystalline thin film by associating cadmium ions, sulfur ions and hydrogen ions and ion-plating them onto a substrate.

The thickness of the polycrystalline semiconductor thin film thus formed is preferably 100 nanometers at minimum because too thin a film may affect the characteristics due to disturbance of crystal structure around the interface with the substrate. For a light emitting device, a photo-sensing device, or a thin film transistor device, the thickness of the polycrystalline semiconductor thin film of 100 μm at maximum is sufficient. When the polycrystalline semiconductor thin film is too thick, it is difficult to externally add monovalent metal to the polycrystal.

The polycrystalline semiconductor thin film of the present invention is formed at a low temperature and the density of the localized levels due to the dangling bonds around the crystal grain boundaries is reduced by adding the monovalent element. Accordingly, a pn junction and a Schottky contact having a good characteristic, which could not be attained by the prior art polycrystalline thin film, can be formed. The pn junction is formed by superimposing a film doped with p-type impurity and a film doped with n-type impurity in the direction of the thickness of the films. A pnp or npn transistor is formed by superimposing a further layer thereon. The thin film pn junction and the Schottky contact devices can be used as photo-sensing devices with a large area, and a junction type or MOS type field effect transistor can be formed by utilizing a depletion layer of the junction or an insulating thin film formed on the polycrystalline thin film. When the substrate on which the polycrystalline semiconductor thin film is formed is an insulative material, device-to-device isolation is easy to form and hence integration of the devices is facilitated.

In the formation of the polycrystalline thin film semiconductor material, by adding a halogen X (X is at least one element selected from F, Cl, Br, and I) and treating the material in a plasma containing cations M$^+$ (M is at least one of hydrogen H and monovalent metals Li, Na, K, and Cs) to introduce both groups of elements, a polycrystalline thin film semiconductor material having polycrystal grain boundaries chemically and electrically quenched can be formed.

The halogen element such as fluorine which quenches the dangling bonds and is charged negatively and the cations such as lithium ions which quench the dangling bonds and are charged positively are sequentially added to neutralize the charges. Since the halogen element which is negatively charged has a large ionic radius, it is preferable to introduce it during the formation of the polycrystalline thin film rather than after the formation thereof. On the other hand, the cation which is positively charged has a small ionic radius and hence it can be readily introduced after the formation of the polycrystalline thin film.

As an example, fluorine and hydrogen are simultaneously introduced in the following manner.

A polycrystalline thin film having fluorine introduced mainly at the grain boundaries is formed on a substrate by sputtering silicon in a mixed environment of argon and SiF$_4$. The sputter target is a high purity silicon crystal, the partial pressure of SiF$_4$ is $10^{-3}$ pa–10 pa (total gas pressure is also 10–3 pa–10 pa), substrate temperature is 550° C.–650° C., sputter RF input power is 0.5 W/cm$^2$–10 W/cm$^2$, and RF frequency is usually 13.56 MHz.

Heat treatment is carried out at a plasma center containing cations. The treatment conditions are as set forth above.

The present method of introducing the impurity can eliminate the following shortcoming. When the crystal grain boundaries are quenched by fluorine, the dangling bonds at the grain boundaries are quenched, but because of the large electronegativity property of the fluorine atom F, the grain boundaries are charged negatively. As a result, there is a high probability that holes are attracted to the grain boundaries resulting in a p-type material. When such a polycrystalline thin film semiconductor is used to form a solar cell, a large leakage current is produced. When it is used to form an n-channel thin film transistor (TFT), the n-channel is broken by the p-type region of the grain boundaries and the mobility is extremely reduced. The above method for introducing the impurity can resolve such a difficulty. The effect is more remarkable when the contents of the halogen element and the element selected from the group consisting of hydrogen and monovalent metal elements are 100 ppm to 10% by atomic ratio, respectively.

It should be understood that a better electronic characteristic is attained even when the elements of both groups described above are not introduced into the semiconductor material but only one selected element is introduced, compared to when no element at all is introduced.

FIG. 1 shows the relation between size of the silicon crystal grain and hydrogen content. As described above, the smaller the grain size is, the greater is the content of the monovalent element because the total amount of crystal grain boundaries increases. The hatched area in FIG. 1 shows a preferable range of hydrogen content. A similar characteristic is exhibited when a monovalent element described above other than hydrogen is used as can be understood from the principle of reducing the density of the localized levels.

Figure 2B:
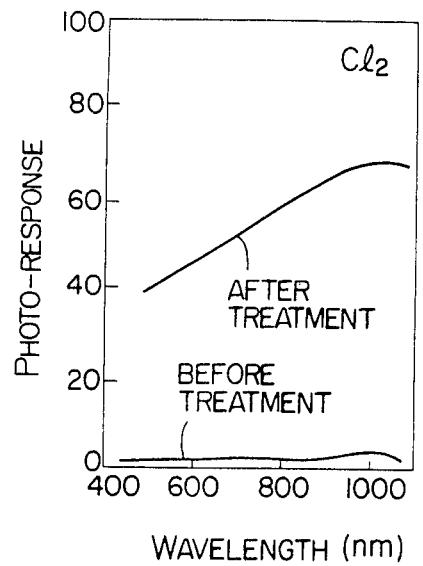
Figure 2C:
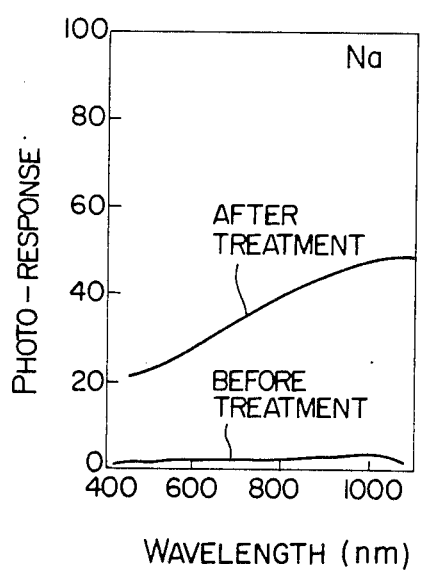
Figure 2D:
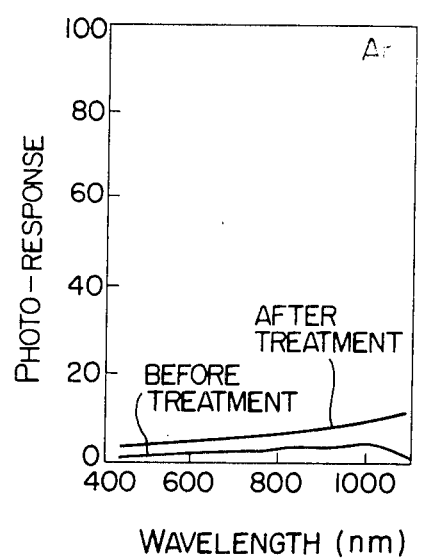

FIGS. 2a–2d show photo-responses measured for polycrystalline silicon films of 2 μm thick formed on quartz substrates by a CVD method and treated in various ways. FIG. 2a shows a comparison of photoresponses of a sample before and after heat treatment in a hydrogen glow discharge, FIG. 2b shows a similar comparison before and after heat treatment in a chlorine glow discharge, FIG. 2c shows a similar comparison before and after heat treatment in a sodium glow discharge, and FIG. 2d shows a similar comparison before and after heat treatment in a glow discharge in an argon environment. FIGS. 2a, 2b and 2c show substantial improvement of photoconductivity over FIG. 2d. The treatment in the argon environment does not provide improvement of the photoconductivity. The treatment conditions for the respective elements are shown in Table 1.

Table 2 shows densities of the localized levels of those samples measured by a field effect method before and after the heat treatment. The reduction of the density of the localized levels of the sample heattreated in the monovalent element glow discharge is remarkable. It is, therefore, considered that the increase of the photoconductivity of the samples is due to the reduction of the density of the localized levels which act as recombination centers.

TABLE 1

| Environment | Hydrogen | Chlorine | Sodium | Argon* | Iodine | Cesium | Remarks |
|---|---|---|---|---|---|---|---|
| Substrate Temperature | 300 | 400 | 450 | 350 | 350 | 500 | (°C.) |
| Plasma Environment Pressure | 6.5 | 3.9 | 6.5 | 1.3 | 2.5 | 3.5 | (Pa) |
| Discharge Power | 30 | 30 | 30 | 30 | 30 | 30 | (W) |

*Comparative example

TABLE 2

| | Before treatment | Hydrogen | Chlorine | Sodium | Argon* | Iodine | Cesium |
|---|---|---|---|---|---|---|---|
| Localized level density in film | $4 \times 10^{19}$ | $3 \times 10^{17}$ | $5 \times 10^{17}$ | $9 \times 10^{17}$ | $2 \times 10^{19}$ | $6 \times 10^{17}$ | $1 \times 10^{18}$ |
| Contents of elements in film | — | $5 \times 10^{20}$ | $8 \times 10^{19}$ | $2 \times 10^{20}$ | $6 \times 10^{19}$ | $1.2 \times 10^{20}$ | $7 \times 10^{19}$ |

*Comparative example
(Unit: atoms/cm$^3$)

It is confirmed by measurement of electron beam induced current that the selected element is introduced mainly around the crystal gain boundaries.

Figure 3:
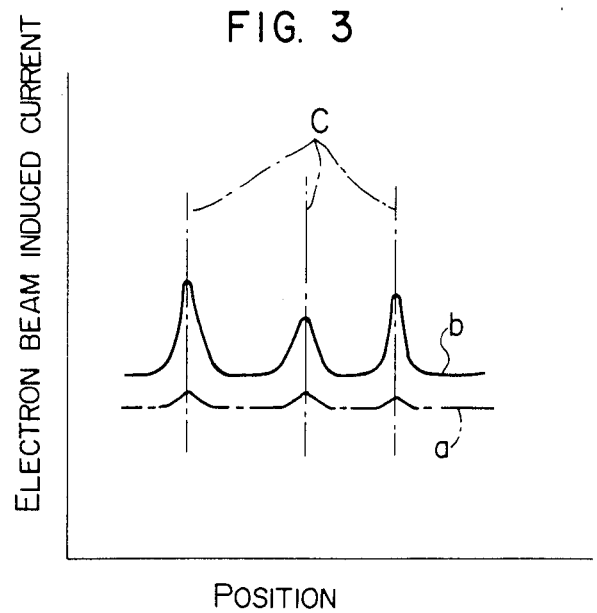
FIG. 3 shows an example of electron beam induced current measured for a polycrystalline semiconductor.

FIG. 3 shows electron beam induced currents measured for the polycrystalline silicon films with and without hydrogen plasma treatment. Curve a shows the former case and curve b shows the latter case. chain line c shows a position corresponding to a crystal grain boundary. For the sample treated by the hydrogen plasma, it is seen that the dangling bonds at the grain boundaries are quenched and the recombination currents at the grain boundaries are substantially reduced.

The effect of the addition of the monovalent element is also confirmed from the standpoint of electron mobility.

A polycrystalline silicon film 1 μm thickness was formed on a quartz substrate at a substrate temperature of 600° C. under an ultra-high vacuum of $2 \times 10^{-7}$ Pa by a molecular beam deposition method. The resulting polycrystalline silicon was treated by an RF input power of 50 W at 13.56 MHz in a hydrogen environment of 0.05 Torr. The substrate temperature during the plasma treatment was 400° C. and the treatment time was 30 minutes.

The electron mobility of the sample was 20 cm$_2$/V.sec while that of the untreated sample was 3 cm$^2$/V.sec. Thus, a remarkable effect was observed.

Accordingly, the present invention reduces the density of the localized levels and improves the photoconductivity characteristic and the carrier mobility.

The present invention is now explained in further detail with reference to examples of semiconductor devices.

EXAMPLE 1

Figure 4:
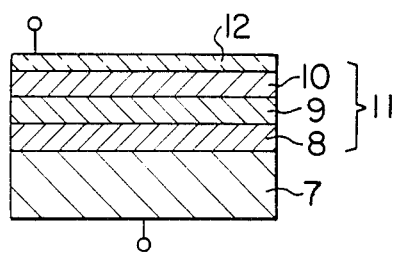
FIGS. 4 to 8 show sectional views of major portions of the semiconductor devices of the present invention.

FIG. 4 shows a sectional view of a solar cell. A stainless steel substrate 7 is placed in a vaouum chamber, and a polycrystalline silicon film 11 is deposited thereon by a glow discharge method at a substrate temperature of 600° C. in an environment of gas mixture of SiF$_4$ and monosilane under a pressure of 2.7 pa. The forming conditions are is shown in Table 3. At an early stage of the deposition of the film, phosphine (PH$_3$) gas is introduced as an impurity source at a pressure of $1.3 \times 10^{-3}$ pa, and at an end stage diborane (B$_2$H$_6$) gas is introduced at a pressure of $1.3 \times 10^{-3}$ pa to form an n-i-p structure. The thickness nesses of n-layer 8, i-layer 9 and p-layer 10 are 300 nm, 5 μm, and 100 nm, respectively. Thereafter, an indium tin oxide film 12 of 300 nm thickness is formed on the p-type polycrystalline silicon film by an RF sputtering device to form a transparent electrode.

TABLE 3

| Gas | SiF$_4$ + SiH$_4$ |
|---|---|
| Total Pressure | 0.7–10 pa |
| SiF$_4$ Partial Pressure | 10–90% |
| Substrate Temperature | 520–680° C. |
| RF Power | 50–350 W |

The resulting film can be used as a thin film solar cell having two electrodes: (1) the stainless steel substrate and (2) the transparent electrode. It has a photoelectric conversion efficiency of 8%. In the present example, it is essential that fluorine and hydrogen are included in the silicon film. The impurity densities in the n-layer, the i-layer, and the p-layer are shown in Table 4.

TABLE 4

| Impurity | Fluorine | Hydrogen | Phosphorus | Boron |
|---|---|---|---|---|
| n-layer | 0.3 | 0.6 | up to 0.1 | 0 |
| i-layer | 0.3 | 0.8 | 0 | 0 |

TABLE 4-continued

| Impurity | Fluorine | Hydrogen | Phosphorus | Boron |
|---|---|---|---|---|
| p-layer | 0.3 | 0.6 | 0 | up to 0.1 |

(Unit: atomic %)

EXAMPLE 2

Figure 5:
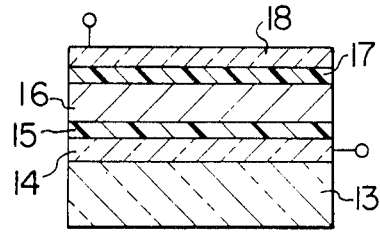

FIG. 5 shows a sectional view of a semiconductor device having a fluorescent film as an electroluminescent plate.

A transparent electrode 14 is formed on a glass substrate 13 by a conventional method and then a blocking layer 15 is formed of $Si_3N_4$ having a thickness of 1000 Å. The glass substrate 13 is then placed in a vacuum chamber and a ZnS: Mn fluorescent material 16 is vapor deposited thereon to a thickness of approximately 3000 Å at a substrate temperature of 300° C. under a vacuum of $7\times10^{-5}$ Torr. Then the fluorescent film is placed in a Na plasma formed in an environment of approximately 6 pa and heat treated at 500° C. for one hour. Then, a blocking layer 17 of $Si_3N_4$ having a thickness of 1000 Å and a transparent electrode 18 are formed thereon. The electroluminescent plate thus formed has a higher photoelectric conversion efficiency than a fluorescent plate formed by other methods and it can be used as a fluorescent plate such as electroluminescent plate.

EXAMPLE 3

The formation of a polycrystalline thin film semiconductor material by a molecular beam epitaxy method is now explained. Polycrystalline silicon is deposited on a quartz or hard glass substrate kept at 500° C. by molecular beam sources of silicon (Si), fluorine (F), and hydrogen (H). The molecular beam sources are such that fluorine is 0.5 atomic % of silicon and hydrogen is 1.0 atomic % of silicon. In the formation process of the polycrystalline silicon film, fluorine (F) and hydrogen (H) are introduced so that they combine with silicon (Si) mainly at the polycrystal grain boundaries to quench the dangling bonds. Extra fluorine (F) and hydrogen (H) are evacuated from a molecular beam epitaxy apparatus through an exhaust port. When a p-type or n-type polycrystalline silicon film is desired, a boron (B) or antimony (Sb) molecular beam source is used in the formation of the film to add B or Sb as an impurity.

Figure 6:
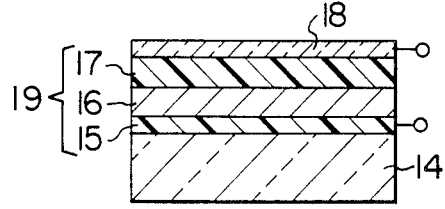

Various types of semiconductor devices can be made by the above method. As an example, the formation of a p-n junction is explained although other semiconductor devices can be formed. FIG. 6 shows a sectional view of a diode. An indium tin oxide (ITO) film of 0.1 μm thickness is formed on a quartz substrate 14 as an electrode 15. The quartz substrate thus prepared is placed in a molecular beam epitaxy apparatus which is then evacuated. A polycrystalline silicon film 19 is formed on the substrate at a substrate temperature of 500° C. by the molecular beam sources of silicon, fluorine, and hydrogen operated as set forth above. Boron (B) is simultaneously deposited during the formation of film 16 to make it p-type. Boron content is 0.05 atomic % of silicon. The thickness of the film 16 is 0.2 μm. Antimony (Sb) is simultaneously deposited during the formation of polycrystalline silicon film 17 to make it n-type. Antimony content is 0.05 atomic % of silicon. The thickness of the film 17 is 1.0 μm. A second electrode 18 is formed thereon to complete the semiconductor device. A substantial reduction of leakage current was observed.

EXAMPLE 4

Figure 7:
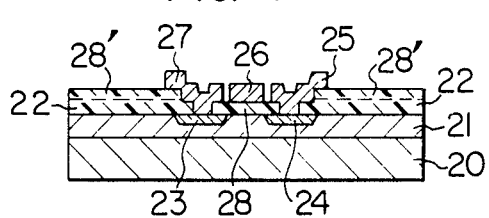

Referring to FIG. 7, the formation of a passivated polycrystalline silicon film by a reactive sputtering method is explained.

A polycrystalline silicon film 21 is deposited on a fused quartz or hard glass substrate 20 kept at 550° C., from a polycrystalline silicon target in a sputtering environment of a mixture of $SiF_4$ and argon (Ar) gases. Conditions for the preparation of the samples are shown in Table 5. Thereafter, the sputtering equipment is evacuated to $10^{-5}$ pa and then $H_2$ gas is introduced to approximately 1 pa and RF power of 13.56 MHz is applied to cause glow discharge (0.2 W/cm²).

TABLE 5

| | Conditions of formation of polycrystalline silicon | | | Contents of F and H in silicon after heat treatment | |
|---|---|---|---|---|---|
| Sample No. | Sputter gas | $SiF_4$ content in gas (%) | Total pressure of gas (Pa) | Fluorine (atomic %) | Hydrogen (atomic %) |
| 1 | $SiF_4$ + Ar | 5 | 0.5 | 0.8 | 0.9 |
| 2 | $SiF_4$ + Ar | 2 | 0.5 | 0.3 | 0.5 |

The polycrystalline silicon film is kept at 350° C. and left in the glow discharge for 30 minutes. As a result, a polycrystalline silicon film having grain boundaries thereof quenched by fluorine (F) and hydrogen (H) is produced. Then, a $SiO_2$ film 22 having a thickness of 5000 Å is deposited at a substrate temperature of 415° C. by a vapor growth method. Windows for a source region 23 and a drain region 24 are formed in the $SiO_2$ film 22. Then, $BF_2^+$ ions of an energy of 150 KeV are implanted at a dose rate of $3\times10^{15}$/cm² and the film is heat treated at 550° C. for 100 minutes to form the P+ layers 23 and 24 in the drain and source regions. The $SiO_2$ film is removed while leaving a field oxidization film. A $SiO_2$ film 28 (28') of 2000 Å thick for the gate oxide film is deposited by the vapor growth method. Electrode contact openings are formed by a photolithographic method, an Al film is deposited on the entire surface and the Al film is lapped to form a source electrode 25, a drain electrode 27 and a gate electrode 26. The substrate is then heat treated at 400° C. for 30 minutes in $H_2$ environment to complete the semiconductor device.

While hydrogen and fluorine are used in the present example, the same effect is obtained when other halogen elements or monovalent metal elements are used, as described above.

By the simultaneous introduction of the halogen (fluorine, chlorine, bromine, iodine) and the selected cation (sodium, lithium, potassium cesium) into the grain boundaries of the polycrystalline semiconductor, the following advantages are obtained:

(1) Heat resistance is increased.

The polycrystalline silicon film of the present example was heated and a temperature at which hydrogen (H) was reemitted was measured. It was 700° C. This is much higher than the temperature of 350° C. at which hydrogen is emitted when the film was passivated only by hydrogen.

(2) Carrier mobility is increased.

The n-type and p-type carrier mobilities of the polycrystalline silicon film reach as high as 20 cm²/V.sec. It indicates that the scatter at the grain boundaries is remarkably reduced. A conventional polycrystal has a carrier mobility of 1-10 cm$^2$/V·sec. Accordingly, the integration of C-MOS thin film transistors is facilitated.

EXAMPLE 5

Figure 8:
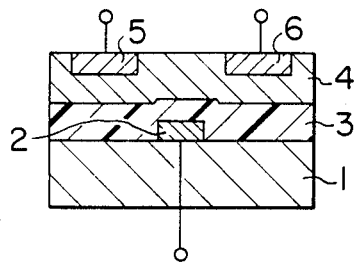

FIG. 8 shows a sectional view of a transistor.

A chromium film of 100 nm thickness is vacuum deposited on a quartz substrate 1, and a gate electrode 2 is formed a by 2 photoetching process. An SiO$_2$ film 3 of 100 nm thick is deposited thereon by a CVD (chemical vapor deposition) process and the substrate is mounted on a vacuum deposition device. A polycrystalline silicon film 4 of 1 μm thickness is formed at a substrate temperature of 450° C. under a vacuum of $3 \times 10^{-7}$ pa by an electron beam deposition method. The formation rate of the polycrystalline silicon film is 0.3 nm/sec. Then the substrate temperature is lowered to 250° C. and the substrate is heat treated for 60 minutes in a glow discharge while introducing hydrogen gas at 4 pa. The hydrogen content is approximately 0.8 at atomic %. B-impurity regions are formed at the regions (5, 6) corresponding to source and drain regions by a conventional ion implantation technique. Then, an aluminum film of 100 nm thick is vacuum deposited at a substrate temperature of 200° C. under a vacuum of $3 \times 10^{-7}$ pa. The sample is taken out of the vacuum deposition device and the source and drain electrodes are formed by a photolithography technique to complete a field effect transistor.

While hydrogen, chlorine, and sodium are shown in the above examples, a similar effect is obtained by plasma treatment employing, other than hydrogen, such as fluorine, bromine, or iodine, or a monovalent metal such as lithium, potassium, rubidium, or cesium.

What is claimed is:

1. A method of forming a semiconductor body, for use in forming at least one semiconductor active device therein, said semiconductor body comprising a polycrystalline semiconductor film on a substrate, comprising the steps of:
   (a) introducing at least one first element selected from the group consisting of fluorine, chlorine, bromine, and iodine into a polycrystalline semiconductor film having dangling bonds at the grain boundaries thereof; and
   (b) introducing at least one second element selected from the group consisting of hydrogen and lithium into said polycrystalline semiconductor film having said dangling bonds;
   each of at least one first element and each of the at least one second element being introduced in respective amounts of 100 ppm to 10% by atomic ratio, with the total amount of all of the first and second elements introduced being up to 40% by atomic ratio, whereby, due to introduction of approximately equal ambinets of both the first and second elements, the mobilities of both the n-type and p-type carriers in the polycrystalline semiconductor film are improved.

2. The method of forming a semiconductor body according to claim 1, wherein the at least one first element and at least one second element are introduced around the monocrystalline grain boundaries of the polycrystalline semiconductor film having dangling bonds.

3. The method of forming a semiconductor body according to claim 1, including the step of forming the polycrystalline semiconductor film, said polycrystalline semiconductor film having dangling bonds at grain boundaries thereof, and wherein the at least one first element and at least one second element are introduced during forming of the polycrystalline semiconductor film.

4. The method of forming a semiconductor body according to claim 1, including the step of forming the polycrystalline semiconductor film, the polycrystalline semiconductor film having dangling bonds at grain boundaries thereof, and wherein the at least one first element is introduced during forming of the polycrystalline semiconductor film.

5. The method of forming a semiconductor body according to claim 4, wherein the at least one second element is introduced after forming the polycrystalline semiconductor film.

6. The method of forming a semiconductor body according to claim 4, wherein the at least one second element is introduced by thermally treating the polycrystalline semiconductor film in a plasma environment of said at least one second element.

7. A method of forming a semiconductor device using the semiconductor body formed by the method of claim 1, comprising the step of forming at least one semiconductor active element at least in part in said semiconductor body.

8. The method of forming a semiconductor body according to claim 1, wherein the polycrystalline semiconductor film is a polycrystalline silicon film.

9. The method of forming a semiconductor body according to claim 1, wherein the polycrystalline semiconductor film is made of a polycrystalline mixed crystal selected from the group consisting of polycrystalline silicon-germanium, a polycrystalline III-V group compound, and a polycrystalline II-VI group compound.

10. The method of forming a semiconductor body according to claim 1, wherein the grain sizes of crystals of the polycrystalline semiconductor film range from several nanometers to several millimeters.

11. The method of forming a semiconductor body according to claim 1, wherein the polycrystalline semiconductor film has a thickness ranging from 100 nanometers to 100 μm.

12. The method of forming a semiconductor body according to claim 1, wherein the at least one second element is introduced by thermally treating the polycrystalline semiconductor film in a plasma environment of said at least one second element.

13. The method of forming a semiconductor body according to claim 1, including the step of forming the polycrystalline semiconductor film, said film being formed at a maximum temperature of 700° C.

14. A method of forming a semiconductor body according to claim 1, wherein at least one of said at least one first element and at least one second element are introduced by thermally treating the polycrystalline semiconductor film in a plasma environment of said at least one of said at least one first element and at least one second element.

15. A method of forming a semiconductor body, for use in forming at least one semiconductor active device therein, said semiconductor body comprising a polycrystalline semiconductor film on a substrate, comprising the steps of:
   (a) introducing at least one first element selected from the group consisting of fluorine, chlorine, bromine and iodine into said polycrystalline semiconductor film; and (b) introducing at least one second element selected from the group consisting of hydrogen, sodium, potassium, rubidium, cesium, and lithium into said polycrystalline semiconductor film;

each of the at least one first element and each of the at least one second element being introduced in respective amounts of 100 ppm to 10% by atomic ratio and the total amount of all of the first and second elements being up to 40% by atomic ratio, whereby, due to introduction of approximately equal amounts of both the first and second elements, the mobilities of both electrons and holes in said polycrystalline semiconductor film are improved.

16. The method of forming a semiconductor body according to claim 15, wherein the at least one second element is lithium.

* * * * *